United States Patent
Selwan et al.

(10) Patent No.: US 9,287,680 B2
(45) Date of Patent: Mar. 15, 2016

(54) SYSTEM AND METHOD TO COMPENSATE FOR FREQUENCY DISTORTIONS AND POLARIZATION INDUCED EFFECTS IN OPTICAL SYSTEMS

(71) Applicant: FAZ TECHNOLOGY LIMITED, Dublin (IE)

(72) Inventors: Ibrahim Selwan, Dublin (IE); John O'Dowd, Dublin (IE); Tom Farrell, Dublin (IE); Martin Farnan, Dublin (IE); Roger Maher, Dublin (IE)

(73) Assignee: FAZ TECHNOLOGY LIMITED, Dublin (IE)

( * ) Notice: Subject to any disclaimer, the term of this patent is extended or adjusted under 35 U.S.C. 154(b) by 0 days.

(21) Appl. No.: 14/653,386

(22) PCT Filed: Dec. 19, 2013

(86) PCT No.: PCT/EP2013/077548
§ 371 (c)(1),
(2) Date: Jun. 18, 2015

(87) PCT Pub. No.: WO2014/096292
PCT Pub. Date: Jun. 26, 2014

(65) Prior Publication Data
US 2015/0349485 A1    Dec. 3, 2015

Related U.S. Application Data

(60) Provisional application No. 61/740,067, filed on Dec. 20, 2012.

(30) Foreign Application Priority Data

Dec. 20, 2012    (EP) .................................... 12198743

(51) Int. Cl.
*H01S 3/10* (2006.01)
*H01S 5/068* (2006.01)
(Continued)

(52) U.S. Cl.
CPC .............. *H01S 5/068* (2013.01); *G01D 5/268* (2013.01); *G01D 18/00* (2013.01); *H01S 3/1303* (2013.01); *H01S 5/0021* (2013.01); *H01S 5/0687* (2013.01); *H01S 5/06804* (2013.01); *H01S 5/06817* (2013.01); *H01S 5/06821* (2013.01); *H01S 5/1092* (2013.01)

(58) Field of Classification Search
CPC ... H01S 5/068; H01S 5/0687; H01S 5/06817; H01S 5/06821; H01S 5/06804; H01S 5/0021; H01S 5/1092
USPC .......................... 372/20, 23, 32, 29.02, 38.08
See application file for complete search history.

(56) References Cited

U.S. PATENT DOCUMENTS

| | | | |
|---|---|---|---|
| 7,649,917 B2* | 1/2010 | Mullane ................ | H01S 5/0625 372/20 |
| 8,923,349 B2* | 12/2014 | Huber ................... | H01S 3/1106 372/18 |
| 2003/0147067 A1 | 8/2003 | Woodside et al. | |

(Continued)

OTHER PUBLICATIONS

International Search Report and Written Opinion for International Application PCT/EP2013/077548; International Filing Date Dec. 19, 2013, pp. 1-12.

*Primary Examiner* — Kinam Park
(74) *Attorney, Agent, or Firm* — William Greener; Bond, Schoeneck & King, PLLC

(57) ABSTRACT

The invention provides a system and a method for wavelength referencing and polarization mitigation. An optical wavelength tunable laser source is swept in a number of contiguous, overlapping sweep segments. A coarse reference wavelength section produces a reference signal that defines at least one absolute wavelength within a sweep segment. A fine wavelength reference section produces a periodic wavelength reference signal that defines a plurality of equidistant wavelengths within each sweep segment with an indeterminate offset relative to the absolute wavelength(s) of the coarse reference wavelength section. The free spectral range of the fine wavelength reference section is smaller than the spacing between subsequent absolute reference wavelengths of the coarse reference wavelength section. This arrangement allows reducing the minimum required overlap between contiguous sweep segments.

17 Claims, 8 Drawing Sheets

(51) Int. Cl.
*H01S 3/13* (2006.01)
*G01D 5/26* (2006.01)
*G01D 18/00* (2006.01)
*H01S 5/0687* (2006.01)
*H01S 5/00* (2006.01)
*H01S 5/10* (2006.01)

(56) References Cited

U.S. PATENT DOCUMENTS

2010/0105148 A1 4/2010 Caracci et al.
2015/0185073 A1* 7/2015 Ibrahim ............... H01S 5/0687
356/454

* cited by examiner

SYSTEM AND METHOD TO COMPENSATE FOR FREQUENCY DISTORTIONS AND POLARIZATION INDUCED EFFECTS IN OPTICAL SYSTEMS

FIELD

The invention relates to a system and method to compensate for instantaneous frequency noise and/or sweep nonlinearities induced by frequency swept tunable lasers used in optical interrogator/characterization systems.

BACKGROUND

Optical sensors (Fibre Bragg Gratings (FBG)) have been proposed for many sensing applications. For example a tunable laser or wavelength swept source can be used to read the values on the sensors arranged in serial or parallel combinations.

The centre wavelengths of the bragg reflectors in the fibre sensors change due to the change in temperature or strain experienced by the sensors. An optical wavelength tuneable/swept source (e.g. a tunable laser) can be used to sweep across all wavelengths covering a certain band (e.g. C/L band) and find the reflected wavelength peak location for each sensor response. These wavelength peak movements are related to the measurement source (e.g. strain, temperature, . . . etc). The system used for the measurement of changes on the FBG sensors is referred to as an interrogator system. The system can also be used to characterize optical components (e.g. optical filters).

The tunable laser in the interrogator system must be swept in a linear fashion in order to measure back a linear response of the FBG. In practice the tuneable source is characterized to generate a linear sweep. The interrogator system disclosed in U.S. Pat. No. 7,649,917, assigned to Intune Networks Limited, provides a tunable laser that scans linearly across all segments that are used to generate a quasi linear sweep over a full operational band (e.g. C/L-bands). The quasi linear sweep was based on stitching multiple overlapping mini-sweeps (segments) using a periodic wavelength reference e.g. Etalon to guarantee full coverage. The Etalons used are typically 25 GHz and minimum of 25 GHz was required to have a common Etalon for stitching, which results in a limit on the maximum achievable sweep rate.

A problem with tunable lasers is that due to aging, environmental temperature changes, an extra overlap would be required to improve the margins and guarantee stitching between segments. Also any induced electrical noise in the tunable laser system, the sweep may not stay linear, and mode jumps in addition to instantaneous frequency noise can occur at the output. Other reported interrogators using continuous swept sources use a wavelength reference for frequency tracking as disclosed in US2010/0105148 A1, assigned to Corning Incorporated. However Corning do not address the stitching and overlap issues for tunable laser sources based on quasi continuous sweeps and potential mode jumps that can occur.

A further problem with FBGs interrogated with interrogation systems based on a polarized tunable lasers, is birefringence which leads to polarization dependence frequency shift (PDFS) which would cause a shift in the peak location and error in the measurement. The interrogator system disclosed in U.S. Pat. No. 7,649,917 address this problem by using a polarization switch/controller in the system. However with tunable lasers based on polarized sources and narrow linewidth lasers, passive de-polarizers (e.g. Lyot depolarizer) are not practical due to the long length of fibre required.

It is therefore an object of the invention to provide a system and method to overcome at least one or more of the above mentioned problems.

SUMMARY

According to the invention there is provided, as set out in the appended claims, a wavelength referencing and polarization mitigation system for use with an optical wavelength tunable source, said system comprising at least one coarse reference wavelength section characterised by a fine wavelength reference section adapted for measuring sensor characteristics or characterizing wavelength dependent optical devices.

In one embodiment there is provided a wavelength referencing and polarization mitigation system for use with an optical wavelength tunable laser source having a number of different sweep segments, said system comprising:
- at least one stable coarse reference wavelength section;
- a fine wavelength reference section adapted for measuring a periodic wavelength response of an optical device having a Free Spectral Range smaller than the coarse reference wavelength section; and
- means for stitching together sweep segments of the tunable laser source wherein the fine periodic wavelength reference provides a relative offset wavelength reference compared to the coarse wavelength reference section, such that the minimum required overlap between sweep segments is reduced.

The invention provides an improved wavelength stitching system and method and overlap margins for discontinuous contiguous sweeps in addition to efficiently mitigate polarization dependency of optical sensors. The invention provides a wavelength reference system that uses means to measure and characterize the wavelength information of the tunable optical swept source with time. This information is used to compensate for any non-linearity in the sweep and instantaneous frequency noise. It also provides an absolute wavelength reference that compensates for any temperature or/and aging induced wavelength drift of the tuneable source.

The invention provides a system where a fine wavelength reference is introduced in the wavelength reference system in addition to the other references (for example an Athermal Etalon (coarse reference) and Gas cell wavelength reference (absolute reference)). This fine wavelength reference is an optical device with a periodic wavelength response such as a Mach-Zehnder interferometer (MZI) which can have a small free spectral range (FSR) compared to the Etalon reference. The MZI can be implemented using different technologies (e.g. fibre based, free-space optics, integrated optical circuits PLC, or built with polarization maintaining (PM) fibre and a polarizer).

In one embodiment the at least one stable coarse reference wavelength section defined by a first measured peak and a second measured peak to provide a start and a stop wavelength of a sweep segment.

In one embodiment the fine reference section comprises a periodic frequency optical device adapted to provide frequency correction of the tunable source generated sweep segments in terms of instantaneous frequency noise and sweep nonlinearity.

In one embodiment the system comprises means to stitch together contiguous sweep segments of the tunable source by using the fine periodic wavelength reference referenced to a coarse wavelength reference as a stitching point.

In one embodiment there is provided means for measuring spacing between the zero crossing points of the periodic wavelength reference to provide control data for the wavelength tunable source.

In one embodiment there is provided means for detecting any discontinuities in the periodic frequency of the optical device wherein detected discontinuities in the periodic frequency provides control data for the wavelength tunable source.

In one embodiment the control data provides means to re-calibrate operating points of the optical wavelength tunable source.

In one embodiment the fine reference section is adapted for pre-compensating nonlinearities in the optical wavelength tunable source.

In one embodiment the reference section comprises at least one gas cell reference adapted to provide absolute frequency information.

In one embodiment the fine reference section comprises a Mach-Zehnder Interferometer (MZI) and a polarization scrambler.

In one embodiment the MZI and scrambler comprises polarization maintaining fibre configured with a desired polarization launch angle and length adapted to provide frequency information and mitigate polarization induced effects in the sensors/filters.

In one embodiment there is provided an active polarization control device adapted to control the state of polarization in an asynchronous or synchronous fashion to mitigate for polarization induced wavelength shifts in interrogated sensors/filters.

In one embodiment the reference section is adapted to receive an electrical control signal from the laser source to control the fine reference section.

If PM fibre is used to build a MZI, then the same fibre could also be used to construct a continuous waveplate that will cause the polarization state to change at the output of the fibre (passive polarization scrambler), therefore providing a polarization reference in parallel with a wavelength reference (MZI) generated at the output of the polarizer.

The polarization scrambling effect can be used to mitigate for the optical fibre sensor (FBG) polarization sensitivity.

An extra high speed polarization scrambler/switch (active polarization scrambler) can replace the PM fibre based passive polarization scrambler or added to the system.

Adding the MZI and polarization scrambler/switch improves the accuracy of the results and reduces the polarization sensitivity of the optical fibre sensors/filters interrogated (e.g. FBGs) by the laser(s) in the system.

Extensions to the system can also be accommodated through the use of multiple lasers sweeping in parallel at different wavelengths and sharing the MZI reference and polarization scrambler/switch. The MZI reference can also be used to calibrate the laser to pre-compensate for any non-linearity in the sweep.

In one embodiment there is provided a trigger signal from the Laser and control section to the receiver section to synchronize the segment sweeps.

In one embodiment there is provided a trigger signal from the Laser and control section to the polarization switch/scrambler section to change the polarization state.

In one embodiment an optical assembly including the reference section is used to provide wavelength (absolute/relative) and power reference signals to the receiver section.

In one embodiment the Interrogator optical splitter section is used to support multiple fibre channels containing optical sensors or devices.

In one embodiment the Interrogator reference system includes a power reference to compensate for any power variations in the output of the tunable laser.

In one embodiment the Interrogator reference system includes one or more periodic frequency optical device such as an Etalon and/or Mach-Zehnder Interferometer used to provide frequency correction of the tunable laser generated sweep segments and/or stitching between neighbouring sweep segments.

In one embodiment the Interrogator wavelength reference system (including the Mach-Zehnder Interferometer) can be used to pre-compensate for wavelength sweep non-linearity.

In one embodiment the Interrogator reference system includes one or more Gas cell reference to provide absolute frequency information.

In one embodiment the MZI and passive polarization scrambler can be constructed by using single or multiple sections of PM fibre with a 45 degree launch angle between the birefringence axes in the first section to split a linearly polarized light into two orthogonal polarization signals. The PM fibre is followed by a polarizer via a PM coupler to construct a MZI. The other output of the PM coupler can be used as a passive polarization scrambler which generates a polarization state synchronous with the wavelength reference generated from the MZI.

In one embodiment an active polarization control device is used to control the state of polarization in an asynchronous (active polarization scrambler) or synchronous (active polarization switch) manner to mitigate for polarization induced wavelength shifts due to the optical sensors polarization dependency.

In one embodiment the system is improved by increasing the number of tunable lasers/swept sources used for sweeping so as to further increase the flexibility and speed at which the sensors are measured.

In one embodiment the sensor comprises a fibre bragg grating and/or any compatible optical sensor/component.

In another embodiment there is provided method of wavelength referencing and polarization mitigation for use with an optical wavelength tunable laser source having a number of different sweep segments, said method comprising the steps of:
  selecting at least one stable coarse reference wavelength section;
  selecting a fine wavelength reference section and adapting for measuring a periodic wavelength response of an optical device having a Free Spectral Range smaller than the coarse reference wavelength section; and
  stitching together contiguous sweep segments of the tunable laser source wherein the fine periodic wavelength reference provides a relative offset wavelength reference compared to the coarse wavelength reference section, such that the minimum required overlap between sweep segments is reduced.

In a further embodiment there is provided a method of minimising the required overlap between sweep segments of an optical wavelength tunable laser source over a number of different sweep segments, said method comprising the steps of:
  selecting at least one stable coarse reference wavelength section;
  selecting a fine wavelength reference section and adapting for measuring a periodic wavelength response of an optical device having a Free Spectral Range smaller than the coarse reference wavelength section; and
  stitching together contiguous sweep segments of the tunable laser source wherein the fine periodic wavelength reference provides a relative offset wavelength reference compared to the coarse wavelength reference section, such that the minimum required overlap between sweep segments is reduced.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

The invention provides a frequency compensation and polarization mitigation system used in a tunable laser based optical interrogator measuring sensor characteristics obtained from an array of optical sensors.

Figure 1:
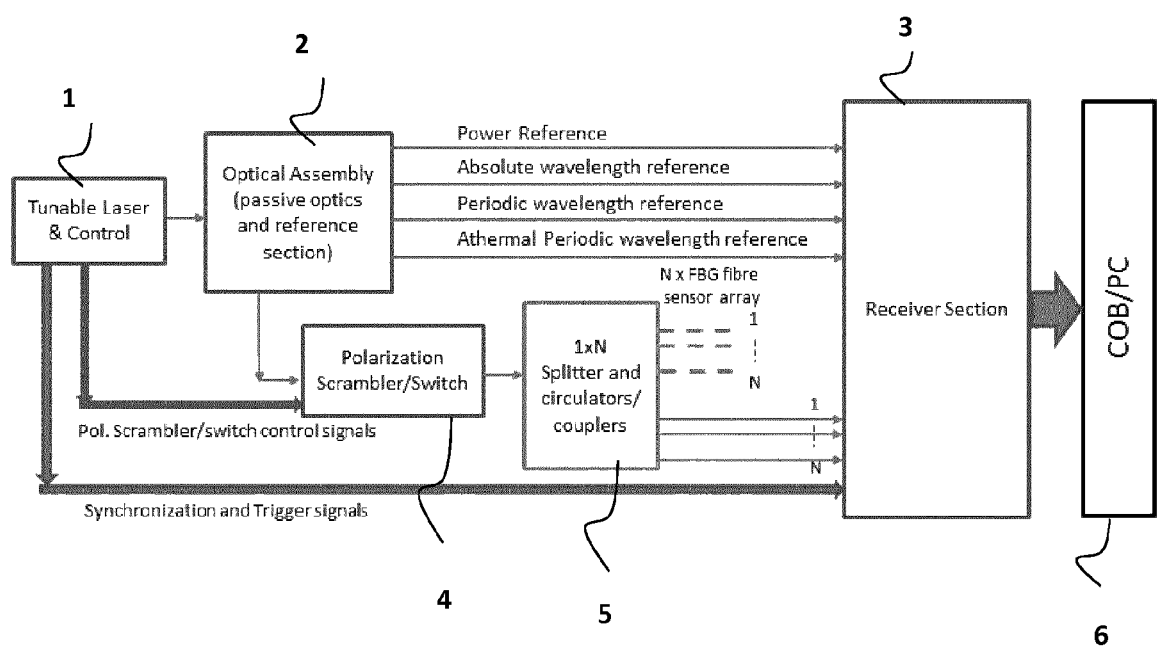
FIG. 1 shows a general block diagram of the main sections and interconnection between them for an N fibre channel tunable laser based optical interrogator.

The interrogator system design is shown in FIG. 1. The interrogator comprises five main sections, namely a tunable laser and associated control unit, 1, an optical assembly, 2, comprising a number of passive optical components (splitters, couplers, circulators, . . . etc), an optical reference system comprising an absolute wavelength reference (Gas cell), one or more periodic wavelength references (Etalon/Mach-Zehnder interferometer MZI, and a power reference, a receiver section, 3, which includes the photo-receivers, analog to digital converters (ADCs), FPGA, a polarization scrambling section, 4, (active/passive), an optical splitter section, 5, and a processing unit, 6, that could be a computer on board unit (COB) or any other processing unit device.

Figure 2:
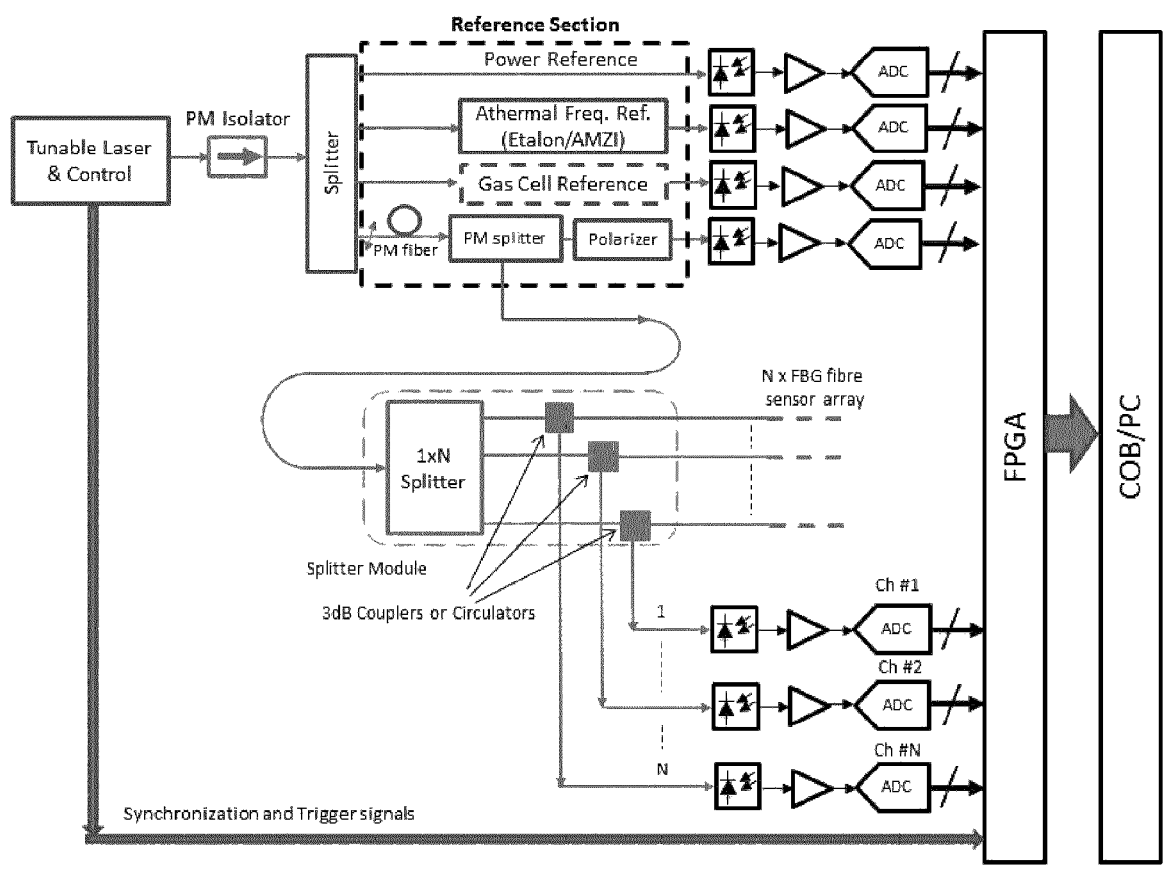
FIG. 2 shows a schematic diagram of an N fibre channel tunable laser based optical interrogator with a PM fibre based MZI and passive polarization scrambler.
Figure 3:
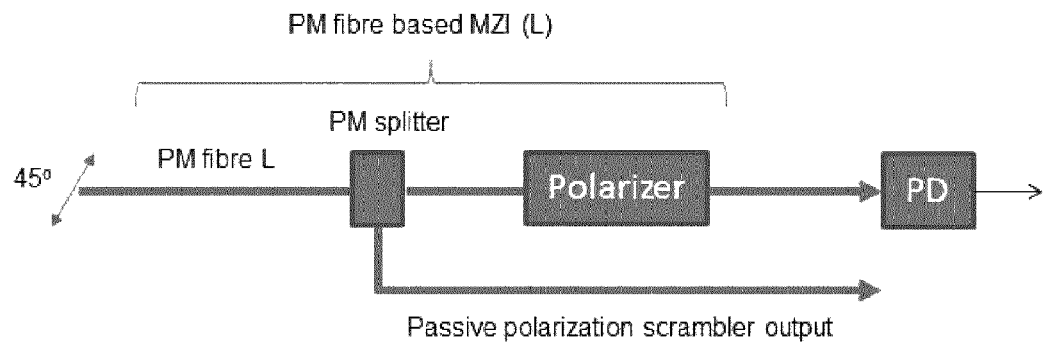
FIG. 3 shows a schematic diagram of the construction of the PM fibre based MZI and passive polarization scrambler.

The interrogator unit in FIG. 2 shows a schematic diagram with the interconnection between the different sections in more detail. The leftmost section will hold the tunable laser transmitters and control unit, the optical assembly will hold the passive optics tray with polarization maintaining components, filters, splitters and splices and reference optical components (Gas Cell. Etalon, Mach-Zehnder Interferometer (MZI), . . . etc). The reference signals output fibres are then guided to the receiver section. In this schematic the PM MZI and PM passive scrambler share the same fibre where one output connected via a PM coupler to a polarizer is used for the MZI and the other output is used as the PM passive scrambler as shown in FIG. 3.

The output of the polarization scrambler is guided to the optical splitter section which includes a 1×N optical splitter and N number of 3 dB couplers/circulators which are then connected to N optical fibre channels that include the optical sensors. The signals reflected back from the sensors are then passed to the receiver section. The receiver section includes the banks of photodiodes and receiver circuits which are connected to a high speed data processing FPGA (Field Programmable Gate Array). The high speed data is processed to reduce the data set and extract the raw/filtered peak wavelengths of the sensors. This processed data is passed from memory to a processor.

Figure 4:
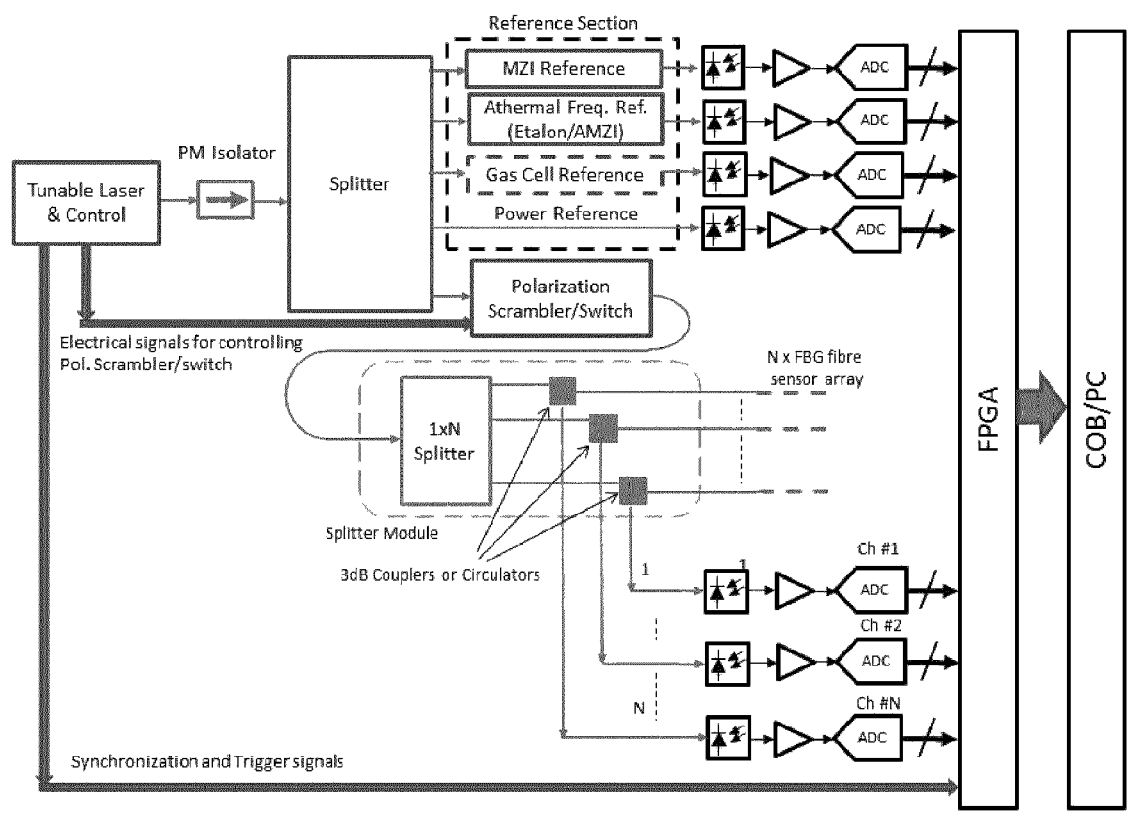
FIG. 4 shows a schematic diagram of an N fibre channel tunable laser based optical interrogator with an active polarization scrambler (Synchronous/Asynchronous)

The interrogator unit in FIG. 4 shows a schematic diagram with the interconnection between the different sections, shown in more detail. The leftmost section will hold the tunable laser transmitters and control unit, the optical assembly will hold the passive optics tray with polarization maintaining components, filters, splitters and splices and reference optical components (Gas Cell. Etalon, Mach-Zehnder Interferometer (MZI), . . . etc). The reference signals output fibres are then guided to the receiver section. In this schematic the MZI can be implemented using any technology (e.g. fibre based, PLC, free space optics).

Figure 5:
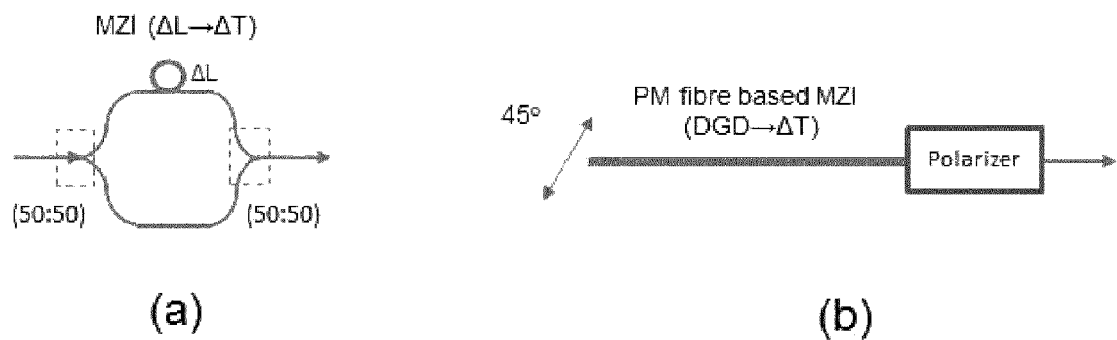
FIG. 5 shows a schematic diagram of the construction of the MZI using PM components (couplers/fibres)

FIG. 5 shows two different implementations, (a) using PM couplers spliced together with a certain path length different to form an interferometer, and (b) using a piece of PM fibre with a certain length (differential group delay) to construct an interferometer when the input is spliced with a 45 degree angle and the output is connected to a polarizer.

Figure 6:
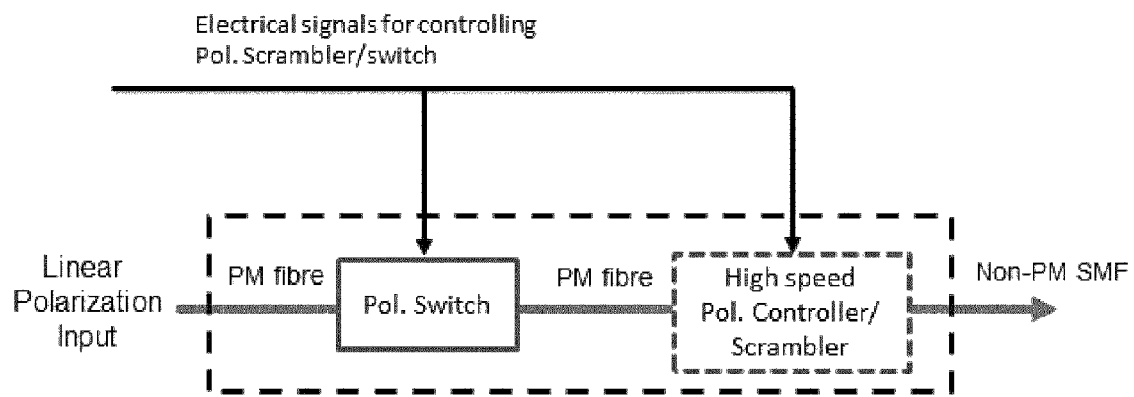
FIG. 6 shows a schematic diagram of the construction of the active depolarizer.

The output of the laser is guided to an active de-polarizer as shown in FIG. 6 which in one embodiment is a high speed polarization switch (with N states, where N>=2) operating in synchronous operation with the laser sweep trigger, or/and a high speed polarization scrambler (asynchronous) which operates at a rate higher than the receiver photodiodes BW and can be constructed using single or multiple wave plates using different technologies (e.g. LiNbO3 based devices).

The output of the polarization scrambler is guided to the optical splitter section which includes a 1×N optical splitter and N number of 3 dB couplers/circulators which are then connected to N optical fibre channels that include the optical sensors. The signals reflected back from the sensors are then passed to the receiver section. The receiver section includes the banks of photodiodes and receiver circuits which are connected to a high speed data processing FPGA (Field Programmable Gate Array). The high speed data is processed to reduce the data set and extract the averaged peak wavelengths of the sensors. This processed data is passed from memory to a processor.

The optics system may consist of a C-band laser covering ~1528-1568 nm and potentially more lasers covering different bands, such as using an L-Band laser covering ~1568-1608 nm, giving an 80 nm total coverage. Using additional laser(s) can increase reliability and increase the number of interrogated sensors. Instead of using an L-band laser to double the number of sensors, an additional C-Band laser can be used instead combined with doubling the number of optical fibres to ensure parallel operation of both laser devices. Each laser output is split into N fibres, where each fibre contains multiple optical FBG sensors, dependent on the space/wavelength spacing between the different sensors and the dynamic range of each to avoid any wavelength overlap. Each tunable laser signal is also used to feed a referencing subsystem which provides the baseline accuracy of the measurement. The interrogator architecture is designed to operate in a quasi-continuous tuning mode such that only segments of interest are selected.

Figure 7:
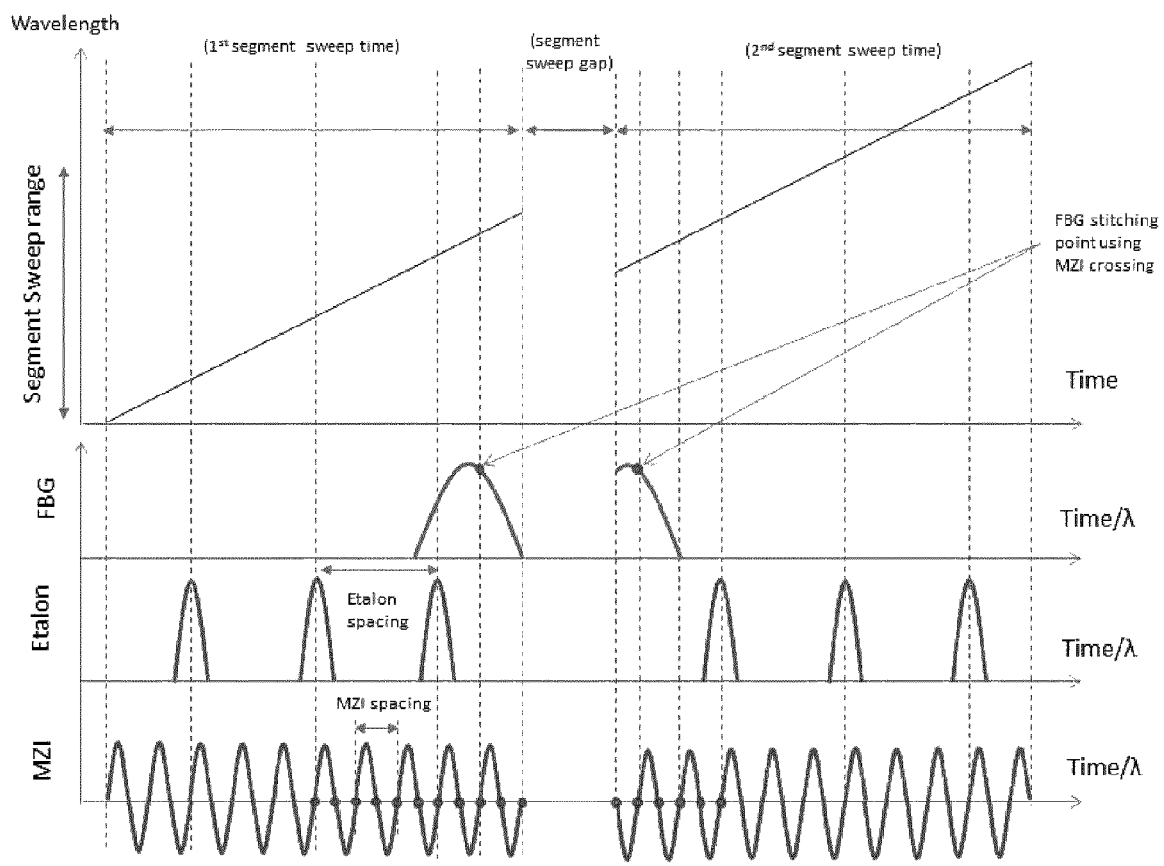
FIG. 7 illustrates a typical reflected FBG response measured over two overlapping sweep segments showing the stitching point using the periodic wavelength reference channels.
Figure 8:
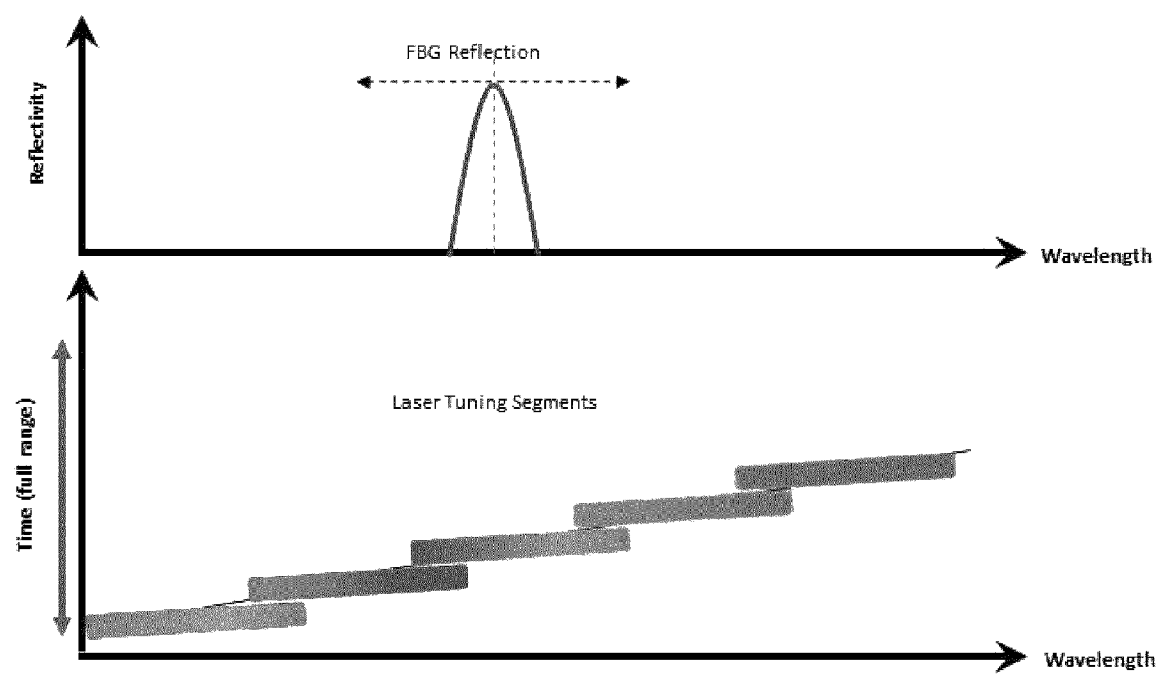
FIG. 8 illustrates the reflected FBG spectrum on a single fibre channel (top) and the overlap between the sweep segments (bottom)

The interrogator design accounts for the fact that the tunable lasers cannot sweep or tune continuously over the full C-Band range. The method can stitch together multiple quasi-continuous tuning sweeps in the current interrogator design in order to achieve a full C-band sweep. FIG. 7 shows an example of two overlapping neighbouring sweep segments used to scan over an FBG sensor. Each sweep segment generates a wavelength reference signal using a stable coarse periodic wavelength reference signal (e.g. an Athermal Etalon) to calibrate a fine periodic wavelength reference signal (e.g. Mach-Zehnder interferometer (MZI)). The wavelength spacing between two Etalon peaks is always constant and the peak locations can be used as coarse wavelength markers for the sweep segment. For the fine wavelength markers the MZI periods (defined by a free spectral range (FSR) smaller than the Etalon peak spacing and having zero-crossing points or peak-through spacing defined by FSR/2) are used. Since the number of MZI periods between two Etalon peaks is constant, this information enables the measurement of the start and stop wavelength of each sweep segment by using the Etalon peak information as an absolute wavelength reference and the MZI information as a relative offset wavelength reference compared to the Etalon peak location. As an example in FIG. 7 the spacing between two Etalon peaks is equivalent to three MZI periods (or 6 MZI crossing points), therefore the wavelength end point of the $1^{st}$ sweep segment is equivalent to its third Etalon peak location plus two MZI periods (4 MZI crossings). While the wavelength start point of the $2^{nd}$ sweep segment is equivalent to its first Etalon peak location minus two and a half MZI periods (5 MZI crossings). Since the number of MZI crossings between neighbouring Etalons is always equivalent to 6 MZI-crossings, a stitching point between the two sweep segments can be calculated based on MZI crossing location (e.g. wavelength location of $1^{st}$ sweep, $3^{rd}$ Etalon+2 MZI crossing is equivalent to $2^{nd}$ sweep, $1^{st}$ Etalon−4 MZI crossings). The stitching point is also shown on an FBG lying on both sweeps. The data outside the stitching point is discarded and a quasi-continuous sweep is constructed by stitching all the sweep segments together. This technique enables the use of long sweep segments with less wavelength overlap when compared with other stitching techniques where only the Etalon peak information is used for stitching sweep segments together. Reducing the wavelength overlap and using longer sweep segments enable the laser to sweep faster.

It will be appreciated that in order to provide the coarse measurement, a stable distinct wavelength response (e.g. peaks, troughs or slopes) can be detected to provide at least one stable wavelength marker. When combined with a fine periodic wavelength reference (e.g. MZI) which provides multiple wavelength markers, the start and stop of a sweep segment can be defined.

There is a controllable time lapse required to switch the laser between each of these segments which will define the final sweep rate. The length of the segments and order are all controlled by the control block in the laser transmitter section. The control block also generates the trigger signals for the active polarization controlling device (switch/scrambler).

Example Operation

Figure 9:
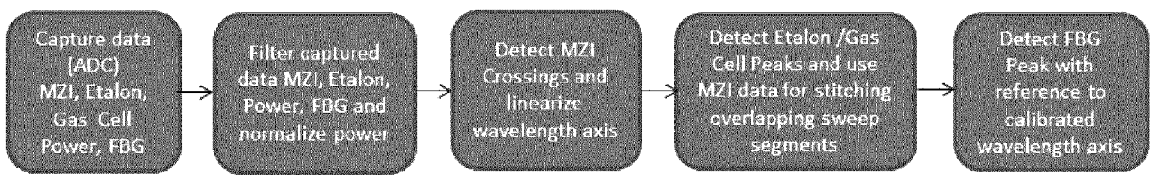
FIG. 9 shows a flow chart for the interrogator main functions to extract the FBG peak information.
Figure 10:
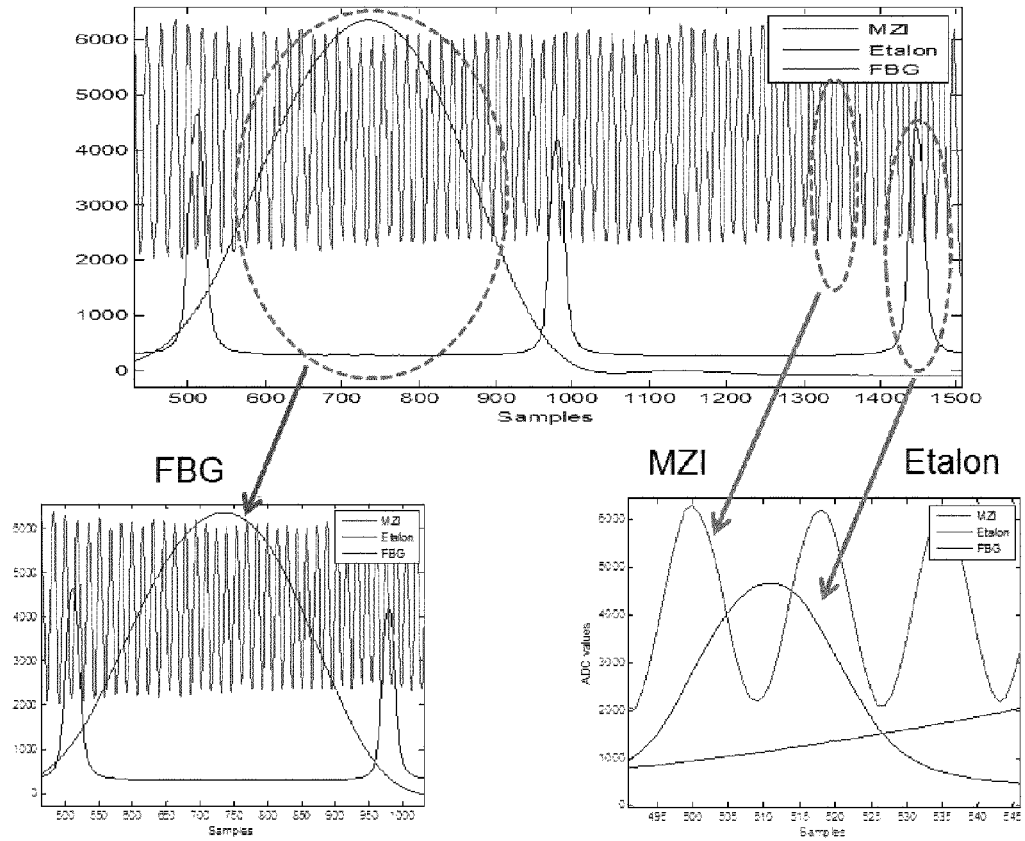
FIG. 10 shows typical sampled ADC values for the FBG, Etalon and MZI signals within a segment sweep.
Figure 11:
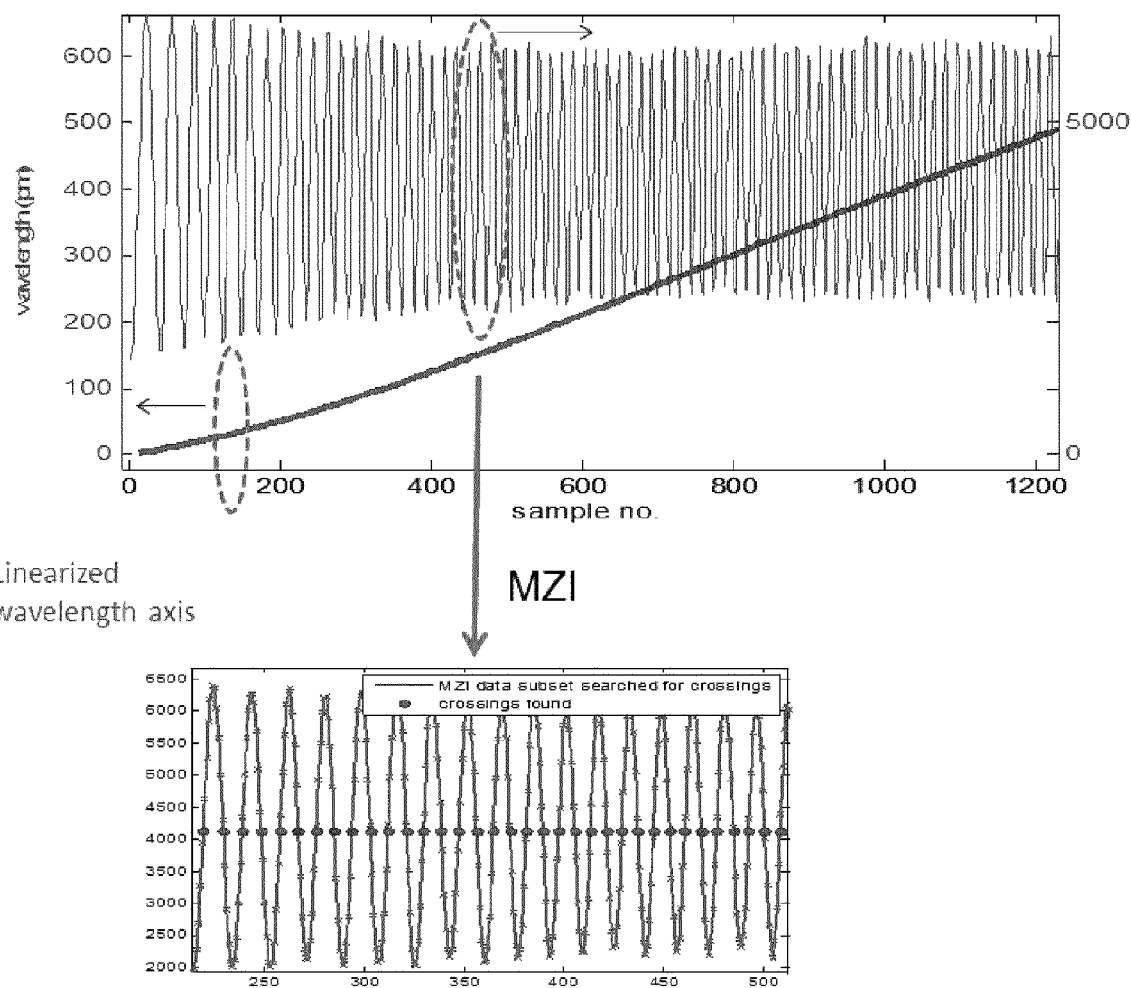
FIG. 11 illustrates how the zero crossing points of the MZI signal can be used to estimate the sweep non-linearity and linearize the wavelength axis.

In operation, the laser performs a wavelength sweep by measuring segments where the wavelength peaks are located. FIG. 9 illustrates a flow chart of the main data processing stages. The reference signals and FBG channels are measured using ADCs as shown in FIG. 10 which are then filtered in the digital domain. The power reference signal is used to normalize any fluctuations in the output power of the laser. The MZI signal is a periodic signal with a fixed free spectral range (FSR) smaller than the Etalon FSR. The zero crossings points are detected and used to estimate the frequency distortion and nonlinearity of the laser output when sweeping as shown in FIG. 11. The Etalon peaks are detected and with the aid of the MZI data, the stitching between the overlapping sweep segments is performed. The Gas Cell absolute reference signal is detected and used to correct for the Etalon frequency measurements to achieve accurate absolute measurements.

With the wavelength axis calibrated the FBG wavelength peak is detected and tracked. Based on the FBG sensor calibration data the wavelength shift is translated to actual measurements (e.g. Temperature/Strain). The processing of blocks in FIG. 9 can be implemented in the FPGA and/or computer on board (COB). Several peak detection algorithms (e.g. Gaussian, Polynomial, Sine, Bisected skirt) could be deployed and optimized based on the application.

In some applications where the FBG sensors exhibit a polarization dependency (e.g. polarization dependent frequency shift PDFS), some means of mitigating this effect is required. In the system shown in FIG. 2, a passive polarization maintaining birefringent fibre is used as a continuous waveplate to scramble the polarization state of the laser source. The passive scrambler is constructed using a piece of PM fibre where the input is spliced with the laser output with a 45 degree angle between the birefringence axes and the other end is connected to a PM coupler/splitter with one output connected to the splitter section for the FBG sensors. The other output of the PM coupler/splitter is followed by a polarizer to construct the MZI as shown in FIG. 3. Since the same PM fibre is used for both the MZI and passive polarization scrambler, the samples measured from the MZI would be synchronous with the polarization change (e.g. peaks on the MZI signal will correspond to a certain polarization state, while the troughs correspond to an orthogonal polarization state). This information could be used to construct two FBG responses corresponding to two orthogonal polarizations. The peaks measured from the 2 FBG responses could be averaged to reduce the FBG polarization sensitivity.

The above approach allows the polarisation and wavelength to be sampled at the same time, and having both effects sampled accordingly in lock step with each other. When the wavelength is swept the rotation of the polarisation becomes wavelength dependent and the polarisation state at the output of the passive scrambler rotates in proportion to the wavelength and the length of the PM fiber.

In FIG. 4, an active depolarizer is used. This can be achieved by using either an N-state polarization switch (synchronous to the laser sweep), a high speed polarization scrambler (asynchronous to the laser sweep), or a combination of both as shown in FIG. 6. An example of the polarization switch is a 2-state orthogonal switch which flips between two orthogonal polarization states every n number of sweeps. When the polarization state applied to the sensor changes between two orthogonal states, a different wavelength shift for the two measurements will be observed depending on the sensor polarization sensitivity. Since this rate of change occurs at a rate higher than the signal bandwidth of interest it can be averaged/filtered out, therefore reducing the impact of low speed polarization variations. If more than 2 polarization states are required to mitigate for the polarization dependency of the measurement, a N-state polarization switch with N greater than 2 can be used. For environments with high frequency vibrations/polarization changes on the fibre, an asynchronous high speed polarization scrambler can be used (e.g. using a high speed LiNbO3 polarization scrambler or a LiNbO3 phase modulator with a 45 degree input polarization angle alignment and driven with an electrical signal with a frequency higher than the receiver BW).

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

In the specification the terms "comprise, comprises, comprised and comprising" or any variation thereof and the terms "include, includes, included and including" or any variation thereof are considered to be totally interchangeable and they should all be afforded the widest possible interpretation.

The invention is not limited to the embodiments hereinbefore described but may be varied in both construction and detail.

The invention claimed is:

1. A wavelength referencing and polarization mitigation system for use with an optical wavelength tunable laser source having a number of different sweep segments, said system comprising:
   at least one stable coarse reference wavelength section;
   a fine wavelength reference section adapted for measuring a periodic wavelength response of an optical device having a Free Spectral Range smaller than the coarse reference wavelength section; and
   a module for stitching together contiguous sweep segments of the tunable laser source wherein the fine periodic wavelength reference provides a relative offset wavelength reference compared to the coarse wavelength reference section, such that a minimum required overlap between sweep segments is reduced.

2. A system as claimed in claim 1 wherein at least one stable coarse wavelength reference will provide at least one stable wavelength marker.

3. A system as claimed in claim 2 wherein the at least one stable wavelength marker comprises a stable distinct wavelength response selected from at least one of peaks, troughs or slopes detected.

4. A system as claimed in claim 1 wherein the fine reference section comprises a periodic frequency optical device adapted to provide frequency correction of the tunable source generated sweep segments in terms of instantaneous frequency noise and sweep nonlinearity.

5. The system as claimed in claim 1 comprises an Etalon for providing the coarse wavelength reference and a Mach-Zehnder Interferometer provides the fine wavelength reference.

6. The system of claim 1 comprising a module for measuring spacing between the zero crossing points of the periodic wavelength reference to provide control data for the wavelength tunable source.

7. The system as claimed in claim 1 comprising a module for detecting any discontinuities in the periodic frequency of the optical device wherein detected discontinuities in the periodic frequency provides control data for the wavelength tunable source and configured to avoid mode jumps in the sweep.

8. The system as claimed in claim 7 wherein the control data is configured to re-calibrate operating points of the optical wavelength tunable source.

9. A system as claimed in claim 1 wherein the fine reference section is adapted for pre-compensating nonlinearities in the optical wavelength tunable source generated sweep.

10. A system as claimed in claim 1 wherein an absolute reference section comprises at least one gas cell reference adapted to provide absolute frequency information.

11. A system as claimed in claim 1 wherein the fine reference section comprises a Mach-Zehnder Interferometer (MZI) and a polarization scrambler.

12. The system as claimed in claim 11 wherein the MZI and scrambler comprises polarization maintaining fibre/s configured with a desired polarization launch angle and length adapted to provide frequency information and mitigate polarization induced effects in the sensors/filters by changing the polarization state of the laser output in synchronous with detected MZI crossings, peaks and troughs.

13. A system as claimed in claim 1 comprising an active polarization control device adapted to control the state of polarization in an asynchronous or synchronous fashion to mitigate for polarization induced wavelength shifts in interrogated sensors/filters.

14. A system as claimed in claim 1 wherein the polarization control section is adapted to receive an electrical control signal from the tunable source.

15. A system as claimed in claim 1 wherein the optical wavelength tunable source comprises a tunable laser or a wavelength swept source.

16. A computer program comprising program instructions when executed by a computer processer causes a computer to control a system for use with an optical wavelength tunable laser source having a number of different sweep segments by performing the steps of:
   selecting at least one stable coarse reference wavelength section;
   selecting a fine wavelength reference section and adapting for measuring a periodic wavelength response of an optical device having a Free Spectral Range smaller than the coarse reference wavelength section; and
   stitching together contiguous sweep segments of the tunable laser source wherein the fine periodic wavelength reference provides a relative offset wavelength reference compared to the coarse wavelength reference section, such that a minimum required overlap between sweep segments is reduced.

17. A method of wavelength referencing and polarization mitigation for use with an optical wavelength tunable laser source having a number of different sweep segments, said method comprising the steps of:
   selecting at least one stable coarse reference wavelength section;
   selecting a fine wavelength reference section and adapting for measuring a periodic wavelength response of an optical device having a Free Spectral Range smaller than the coarse reference wavelength section; and stitching together contiguous sweep segments of the tunable laser source wherein the fine periodic wavelength reference provides a relative offset wavelength reference compared to the coarse wavelength reference section, such that a minimum required overlap between sweep segments is reduced.

* * * * *